United States Patent [19]

Tarui et al.

[11] 3,950,777

[45] Apr. 13, 1976

[54] FIELD-EFFECT TRANSISTOR

[75] Inventors: Yasuo Tarui, Kurume; Yutaka Hayashi, Hoya; Toshihiro Sekigawa, Yokohama, all of Japan

[73] Assignee: Kogyo Gijutsuin, Japan

[22] Filed: Mar. 15, 1973

[21] Appl. No.: 341,755

Related U.S. Application Data

[63] Continuation of Ser. No. 61,906, Aug. 7, 1970, abandoned.

[30] Foreign Application Priority Data

| Aug. 12, 1969 | Japan | 44-63257 |
|---|---|---|
| Sept. 18, 1969 | Japan | 44-73849 |
| Oct. 14, 1969 | Japan | 44-81501 |
| Oct. 14, 1969 | Japan | 44-81502 |
| Oct. 14, 1969 | Japan | 44-81503 |
| Oct. 20, 1969 | Japan | 44-83209 |

[52] U.S. Cl. ................... 357/23; 357/15; 357/41; 357/90; 148/187
[51] Int. Cl.² ............................................ H01L 29/78
[58] Field of Search...... 317/235 B, 235 E, 235 UA, 317/235 AE; 357/23, 41, 15, 90

[56] References Cited
UNITED STATES PATENTS

| 3,271,201 | 9/1966 | Pomerantz | 148/33.3 |
| 3,456,168 | 7/1969 | Tatom | 317/235 |
| 3,461,360 | 8/1969 | Barson et al. | 317/235 |
| 3,463,974 | 8/1969 | Kelley et al. | 317/235 |
| 3,513,366 | 5/1970 | Clark | 317/235 |
| 3,573,490 | 4/1971 | Sevin et al. | 307/221 |
| 3,685,140 | 8/1972 | Engeler | 29/571 |
| 3,711,940 | 1/1973 | Allison et al. | 29/571 |
| 3,714,525 | 1/1973 | Brown et al. | 317/235 R |
| 3,767,984 | 10/1973 | Shinoda et al. | 317/235 R |

FOREIGN PATENTS OR APPLICATIONS

| 821,733 | 8/1969 | Canada | 317/235 |

*Primary Examiner*—Andrew J. James
*Assistant Examiner*—Joseph E. Clawson, Jr.
*Attorney, Agent, or Firm*—Robert E. Burns; Emmanuel J. Lobato; Bruce L. Adams

[57] ABSTRACT

Disclosed herein is an improved field-effect transistor, having its effective base width determined by the impurity diffusion length or by a difference between impurity diffusion lengths for providing a reduced parasitic capacitance between gate and drain, and/or between gate or drain and other electrode. Disclosed also is a construction for effectively leading out an electrode from the base region and or source region, and methods adapted to manufacture the above-mentioned field-effect transistor.

1 Claim, 51 Drawing Figures

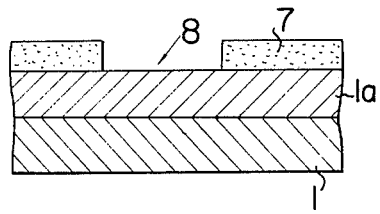 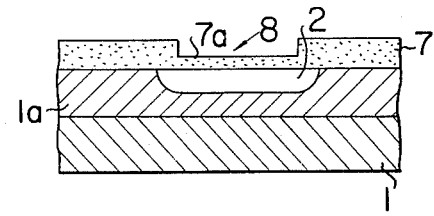
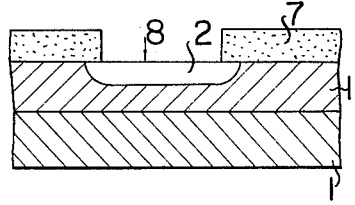 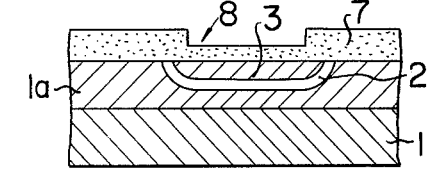
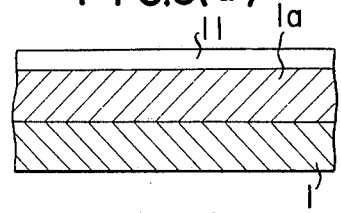 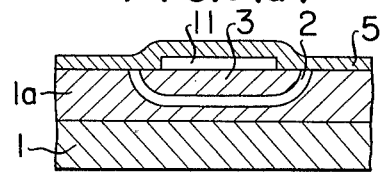
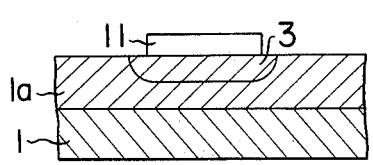 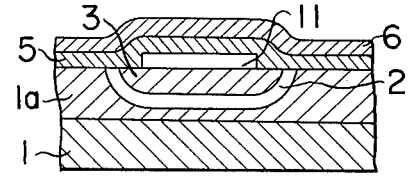
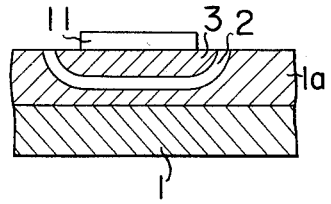 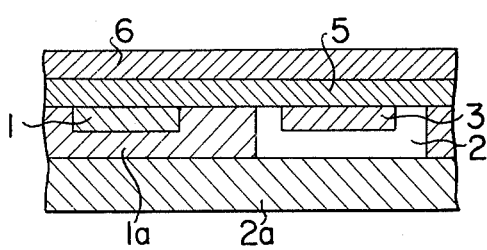

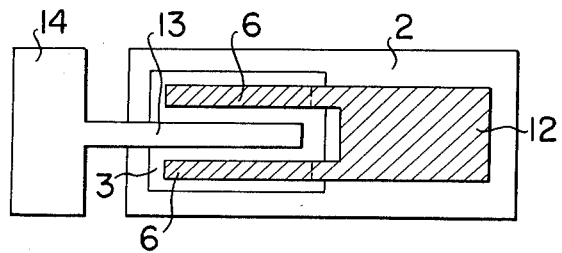
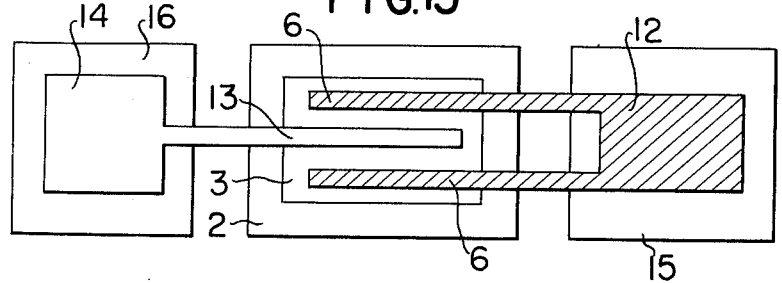
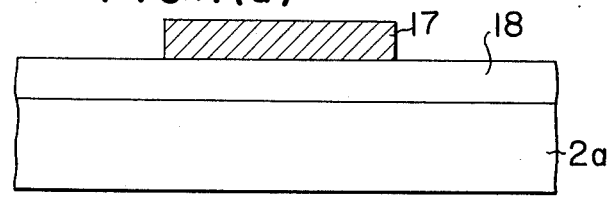
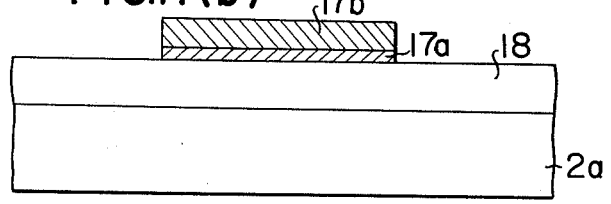
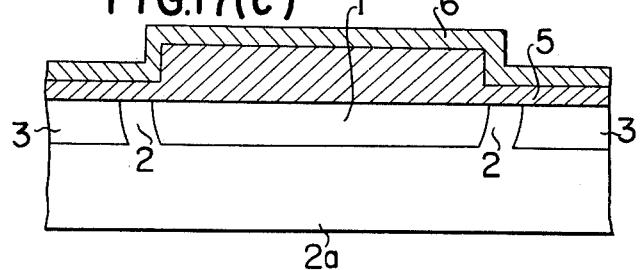

FIELD-EFFECT TRANSISTOR

This is a continuation of application Ser. No. 61,906, filed Aug. 7, 1970, now abandoned.

BACKGROUND OF THE INVENTION

In the conventional field-effect transistors, there exist the following drawbacks.

1. Particularly, in field-effect transistors in which the effective base width is determined by impurity diffusion length or by the difference between impurity diffusion lengths, it has been very difficult to attain desirable high frequency characteristics due to intrinsic characteristics determined by said effective base width.
2. Parasitic capacitance or feedback capacitance between gate and drain, or parasitic capacitance between drain and base, or between gate or drain and other electrodes cannot be reduced to a negligible extent, wherefore these parameters affect frequency characteristics, stable amplification and the like.
3. Various functions are affected by the accuracy of photoengraving dimensions and photoengraving positioning.
4. Fluctuation of drain or collector resistance is relatively large.

SUMMARY OF THE INVENTION

Therefore, it is a first object of the invention to provide a field-effect transistor adapted to super high frequency, in which the main cause of a limitation preventing such frequency characteristics due to the effective base width is removed.

It is a second object of the invention to provide a field-effect transistor which is protected from an excess increase of the capacitance between gate and drain.

It is a third object of the invention to provide a field-effect transistor in which the feedback capacitance between gate and drain is made small by surrounding at least a portion of drain region with source region.

It is fourth object of the invention to provide a field-effect transistor in which the feedback capacitance between gate and drain is made small by increasing the thickness of the insulating layer at a position above the drain region, thereby improving the frequency characteristics.

It is a fifth object of the invention to provide a field-effect transistor capable of attaining a stable amplification even in the range near its cut-off frequency.

It is another object of the invention to provide a field-effect transistor in which the capacitance between drain and base regions is reduced, whereby the transistor is made suitable for high frequency use and for a highly compact structure.

It is a further object of the invention to provide a field-effect transistor having a channel length which is determined by the difference between impurity diffusion lengths, in which the capacitance between gate and the drain is made small and drain to source leakage current is low.

The foregoing and other objects of the invention and functions and characteristic features of the invention will become apparent from the following detailed description taken in conjunction with the accompanying drawings, in which the same or equivalent members are designated by the same numerals and characters.

BRIEF DESCRIPTION OF THE DRAWINGS

FIGS. 7(a), (b), (c) and (d) show, respectively, processes for manufacturing the example of FIG. 4;

FIG. 8 shows a sectional view a modification of the example shown in FIG. 4;

FIGS. 9 (a), (b), (c), (d) and (e) show, respectively, processes for manufacturing the example of FIG. 4;

FIGS. 14 and FIGS. 15 show, respectively, plane views of improvements of the transistor shown in FIGS. 10 and 13;

FIGS. 17(a), (b) and (c) show, respectively, sectional veiws for describing processes of manufacturing an example according to the invention, said example being an improvement of the transistor shown in FIG. 16;

DETAILED DESCRIPTION OF THE INVENTION

If the channel length of a field-effect transistor the can be made substantially equal to base width of a bipolar transistor, high frequency characteristics of said field-effect transistor may be more excellent than those of the conventional bipolar transistor from theoretical point of view. However, frequency characteristics of the conventional field-effect transistors are inferior to those of the conventional bipolar transistors because of the following reasons.

a. Channel length of the field-effect transistor depends generally on photoengraved dimension in the plane direction and can hardly be made to be less than a few microns.

b. If the channel length of the field-effect transistor is made to be extremely short, electric characteristics such as output conductance and break-down voltage in said transistor become inferior. Consequently, for the purpose of making the channel length of the field-effect transistor short so that its electric characteristics such as output conductance and the like may be maintained within practical range, impurity concentration of the drain region at least one portion thereof adjacent to the channel should be lower than that of semiconductor region forming the channel.

Hithertofor, such construction as mentioned above has required a highly accurate photoengraving technique, that is, minute positioning with high accuracy.

Figure 1:
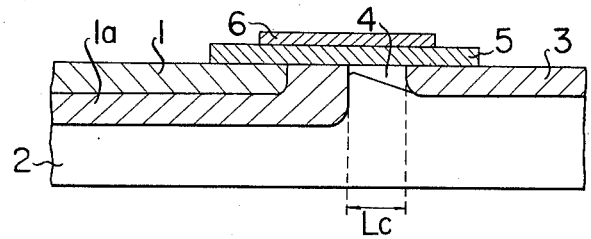
FIG. 1 shows a sectional view of a conventional gate insulating type field-effect transistor.

Prior to detailed description of an example of the invention, a conventional method of manufacturing a field-effect transistor will be described in connection with FIG. 1, as follows. If in a field-effect transistor comprising a drain region 1a, a semiconductor base region 2 forming a channel 4 therein, a drain region 1, a source region 3, a gate electrode 6, and the gate insulating layer 5, improvement of electrical characteristics and making the channel length $L_c$ short are contemplated by providing the drain region 1a impurity concentration of which is lower than that of the semiconductor region 2 forming the channel 4 therein, positioning procedure for manufacturing various regions with photomasking requires high accuracy in the case of the conventional method, because the drain region 1a having a low impurity concentration and both the drain region 1 and the source region 3 having a high impurity concentration are to be individually manufactured with different photomasks, and positioning of plane pattern of the region 1a with plane pattern of the regions 1 and 3 should be attained with extremely high accuracy.

Furthermore, since determination of lower limit of the channel length $L_c$ depends also on dimension accuracy of photoengraved plane pattern of the source region 3, it has been hardly possible to obtain a channel length less than 1 micron.

Figure 2:
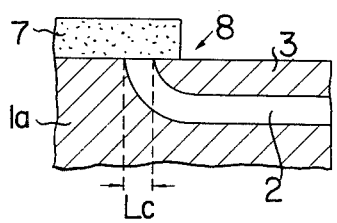
FIG. 2 shows a sectional view of an essential part of an example according to improvement of the transistor shown in FIG. 1.

An example of the improvement of the field effect transistor shown in FIG. 1 will be described in connection with FIG. 2, in which the numerals 1a, 2, 3, 7 and 8 indicate, respectively, a drain region, a semiconductor base region in which a channel is formed, a source region, an oxide layer made of $SiO_2$ and used as a mask used in diffusion process, and a diffusion hole. In this example, the semiconductor base region 2 and source region 3 are formed by double diffusion or alloying and/or diffusion by means of the same positioning means utilizing the diffusion hole 8, so that it is only necessary to determine the channel length $L_c$ by the portion of the difference between diffusion lengths of said regions 2 and 3 or between said region 1a and said diffused region 3, said portion being exposed on the semiconductor surface. In this case, since the impurity concentration of the drain region 1a becomes lower than that of the region 2 forming the channel therein, electrical output characteristics would not become inferior in comparison with the conventional case, even when the channel length $L_c$ is made to be very short.

Figures 3A, 3B:
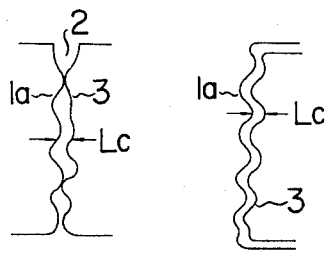
FIGS. 3(a) and 3(b) show, respectively, conventional and the improved steps for determining channel dimensions.

According to the method of determining channel length by means of double diffusion from the same diffusion hole, even when irregularity is produced at end edges of the photoengraved plane pattern, a predetermined channel length $L_c$ is always obtained as shown in FIG. 3(b), but when different photomasking patterns are utilized as in the conventional cases, edge of the plane pattern for determining the source region 3 and that of the plane pattern for determining the drain region 1a are different in their shapes as shown in FIG. 3(a) and accordingly, the channel length $L_c$ becomes irregular, whereby in the case of manufacturing an element with a photoengraving accuracy near its limit, the source region 3 and drain region 1a are brought in contact with each other, thus causing electrical short-circuit.

Figure 4:
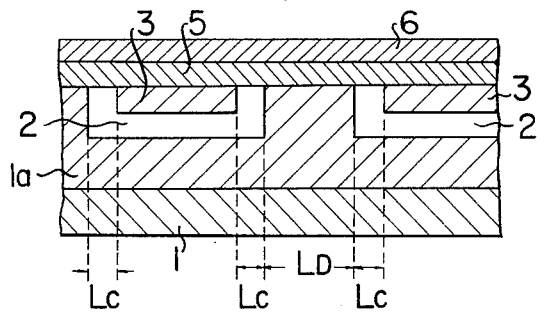
FIG. 4 shows a sectional view of an example according to the invention, wherein the channel dimension is determined by the method according to FIG. 3(b)
Figure 5:
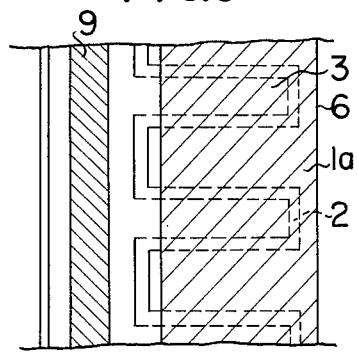
FIGS. 5 and 6 are plane views of the example shown in FIG. 4.
Figure 6:
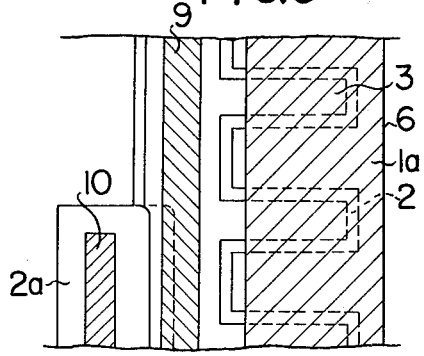

Referring to actual examples of the invention shown in FIGS. 4, 5, and 6, the transistor comprises a source region 3, a drain region 1a, a semiconductor base region 2 forming a channel therein, a gate insulating layer 5, a gate electrode 6, and a semiconductor substrate 1 corresponding to drain region having a large impurity concentration. If impurity concentration N (number of atoms/cm$^3$) of the drain region 1a having a low impurity concentration and distance $L_D$ (micron) between the semiconductor base regions 2 satisfy the following relation $$4 \times 10^7 / \sqrt{N} \geq L_D$$

and silicon is used as the semiconductor, a depletion region spreads under the gate electrode 6 even in the case of zero drain voltage, thus causing remarkable decrease of the feedback capacitance between the gate electrode and drain region. Accordingly, even when the gate electrode 6 is provided along and above the drain region 1a, semiconductor base region 2 and source region 3, frequency characteristics of the transistor are not deteriorated, so that minute dimension of the gate electrode 6 is not required even when channel length is extremely short differring from the case of conventional MOS field-effect transistors, thus causing no necessity of extreme accuracy of the photoengraving. FIG. 5 shows a plane structure of the transistor shown in FIG. 4 and illustrates that the gate electrode 6 is provided on the gate insulating layer 5 and extends along and above the main operating region i.e. the comb-shaped source region 3 and base region 2 in which channel is formed, and a contact 9 to be connected to the source region 3 is provided at a position adjacent to said regions 2 and 3. As will be understood from the structure shown in FIG. 5, the parts requiring accurate photoengraving with respect to dimension are only the width portions of the rectangular comb-shaped structure and the portions affecting the positioning of the contact 9 on the source region 3, and the main operating region is not affected by the photoengraving.

In other words, if it is assumed that the ratio of gate-channel capacitance to resultant capacitance consisting of the gate-source capacitance and gate-drain capacitance is made the same as that in the conventional transistor, it is easy to obtain a channel length of about 0.5 micron in the case when minimum dimension of the photoengraving is one micron, and furthermore, the channel length can be made very short irrespective of minimum dimension of the photoengraving, whereby frequency characteristics also can be improved in proportion to said decrease of the channel length.

Referring to example shown in FIGS. 4, 5, and 6, leading-out of a terminal from the base region 2 in which the channel is formed can be easily attained by a region 2a the conductivity type of which is the same as the region 2 and which is provided by another processing step, into which the source region 3 is not diffused and by leading out said region 2a through a contact 10, as shown in FIG. 6. However, even when the region 2 is electrically floated, voltage gain can be still high, because capacitance between the region 2 and the drain region 1a can be made to be less than 1/10 of the capacitance between the regions 2 and 3 by means of selecting the impurity concentration in a suitable manner.

The method of manufacturing the transistor illustrated in FIG. 4 will be described in detail in connection with FIG. 7.

1. A diffusion hole 8 adapted to selective diffusion is firstly formed in an oxide layer 7 by means of photoengraving technique (FIG. 7a).
2. An impurity is selectively diffused through the diffusion hole 8, thereby to form a region 2 (FIG. 7b).
3. The same diffusion hole 8 as that formed in the process (1) is formed again by subjecting an oxide layer 7a containing an impurity and formed in the process (2) and the layer 7 used for diffusion masking to simultaneous engraving by utilizing the fact that thickness and etching velocity of said oxide layer 7a and those of said layer 7 are different, respectively (FIG. 7c). Of course, if thickness of the oxide layer 7a is controlled so as to be very thin, said process (3) may be omitted.
4. Nextly, a region 3 is formed by selective diffusion through the diffusion hole 8 in the same manner as that of the process (2) (FIG. 7d).
5. A part of the oxide layer is removed off and a gate insulating layer 5 is formed.

Then, contact holes for leading out terminals are formed and a gate electrode metal is deposited by evaporation, and said deposited metal layer is subjected to photoengraving, whereby a gate electrode 6 and electrodes to be connected to the gate electrode 6, source region, and base region forming a channel therein are formed. Electric connection of the drain region is achieved from rear sides of the transistor, but it may be also possible to make the electrical contact to the drain region from the surface, by the diffusion of the same type of impurity as the source providing a metallic electrode at said diffused portion. In the case of other example of this invention, shown in FIG. 8, a portion becoming a drain region having a low impurity concentration is previously provided on a substrate 2a and then the region 2 forming a channel therein and source region 3 are formed from the same diffusion hole. In this case, if a diffusion hole is formed in the diffusion masking oxide layer on the region acting as a drain region having a low impurity concentration prior to diffusion of the source region, the drain region 1 can be diffused at the same time as the diffusion of the source region 3. According to the structure shown in FIG. 8, since the substrate 2a has the same inpurity type as that of the region 2 in which the channel is formed, an isolation diffusion as needed in the example of FIG. 6 is not necessary. In the example of FIG. 8, when the drain region 1 and source region 3 are made to be mutually near in such a degree as that depletion layer spreads toward the drain region 1a having a low impurity concentration within practical voltage range, large current can be handled, but such highly accurate photoengraving as in the case of obtaining the short channel length $L_c$ by the conventional technique is not required.

The above-mentioned examples of the invention relates to the cases in which double diffusion is adopted, but the invention may be embodied by using alloying together with diffusion. This example is shown in FIG. 9, method of manufacturing said example being described as follows.

1. Firstly, a metal 11 containing an impurity of opposite conductivity type to that of a drain region 1a and capable of forming silicide (or compound of silicon and metal) is deposited by evaporation (FIG. 9a).
2. Secondly, photoengraving necessary for a source region is carried out and maintaining the device in a high temperature atmosphere in order to produce silicide, thereby to produce the source region 3 (FIG. 9b).
3. Thirdly, the impurity contained in the metal is made to diffuse at a temperature lower than the temperature adapted to form silicide, thereby to provide a region 2 forming a channel therein (FIG. 9c).
4. Fourthly, a gate insulating layer 5 is made to adhere according to a means such as vapor-phase reaction (FIG. 9d).
5. Fifthly, a gate electrode 6 is deposited by evaporation (FIG. 9e).

In carrying out the above-mentioned processing a, schottky junction between the metal layer 11 and region 2 may be utilized as the source junction by means of utilizing a metal which cannot produce the silicide. Furthermore, it may be possible that in the case when deterioration of the semiconductor surface may occur, a protection layer may be provided on the semiconductor surface prior to or after adhesion of the metal layer 11 in the process of forming the silicide.

According to the invention, as clear from the description relating to the examples mentioned above, the frequency limit of the field-effect transistor can be improved to a value corresponding to ten times of those of the conventional transistors. Furthermore, since the depletion layer spreads toward the drain region and, channel length and drain break-down voltage can be independently designed, whereby phenomenon at the drain region can be controlled by varying channel current from the gate electrode.

Figure 10:
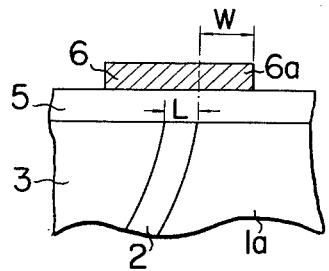
FIG. 10 shows a sectional view a part of another conventional field-effect transistor.

High frequency characteristics of a field-effect transistor are essentially determined by its channel length L and gate-drain feedback capacitance $C_{GD}$, and the more these parameters are decreased, the more said characteristics become excellent. The channel length of the field-effect transistor can be easily made less than 1 $\mu$ by the methods mentioned in connection with FIGS. 4 to 9. An example thereof is shown in FIG. 10, said example comprises a drain region 1a and a source region 3, a base region 2 in which a channel is formed, a gate insulating layer 5, and a gate electrode 6. According to the field-effect transistor shown in FIG. 10, the channel length L can be easily made to be less than 1 $\mu$ and a depletion layer can be spreaded toward the drain side by decreasing impurity concentration of a portion of the drain region 1a, said portion adjoining to the base region 2, in comparison with that of the base region, thereby to improve static characteristics, whereby a field-effect transistor having an intrinsic cut-off frequency $f_{co}$ of the order of several tens giga-herz can be easily obtained. On the other hand, however, the gate-drain feedback capacitance $C_{GD}$ is determined by width W of a portion 6a of the gate electrode 6 above the drain region 1a and the cut-off frequency $f_c$ is represented by the following equation $$f_c \approx f_{co} \bigg/ \left(1 + \frac{2W}{L}\right)$$

However, if let it be assumed that positioning and photoengraving accuracies are, respectively, considered as 1 μ from manufacturing point of view, the width W may become 4 μ in the worst case, and said accuracies fluctuate within said range of 4 μ. Accordingly, if the channel length L corresponds to 0.5 μ, the cut-off frequency $f_c$ fluctuates from the intrinsic frequency $f_{co}$ to $$\frac{f_{co}}{17},$$

so that when the yield of products is considered, merit caused by decreasing the channel length will be lowered. Furthermore, if the gate-drain feedback capacitance is large, stable amplification at a frequency near the cut-off frequency will become difficult. This disadvantage can be effectively eliminated by planarly surrounding at least one portion of the drain region with source region, thereby to decrease the gate-drain feedback capacitance.

Figure 11:
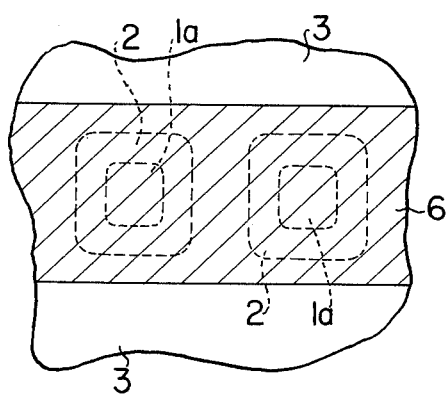
FIG. 11 shows a plane view of an essential part of an example of the invention, said example being an improvement of the transistor shown in FIG. 10.

An example of the field-effect transistor having low gate-drain feedback capacitance is shown in FIG. 11, in which the drain regions 1a are surrounded by the source regions 3 through respective base regions 2, and the gate electrode 6 is made to adhere to the hatched portion of the regions. The transistor shown in FIG. 11 can be manufactured by a method described below in connection with FIG. 12.

Figure 12A:
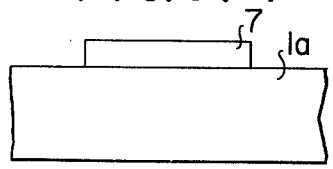
FIG. 12 shows sectional views explanatory of processes of manufacturing the transistor shown in FIG. 11.
Figure 12C:
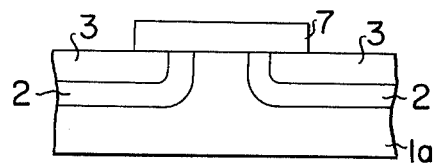
Figure 12B:
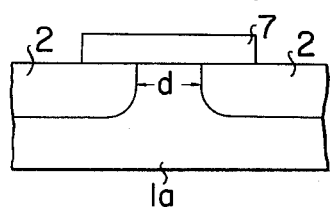
Figure 12D:
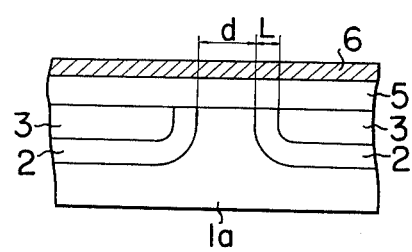

1. Firstly, an insulating layer 7 for masking is formed on n type semiconductor drain region 1a (FIG. 12a).
2. Secondly, p type impurity is selectively diffused using the layer 7 as the diffusion mask, whereby p type base region 2 are produced, because p type impurity is not diffused into the upper central portion of the drain region 1a beneath the insulating layer 7 (FIG. 12b).
3. Thirdly, n type impurity is diffused into the base regions 2, whereby n type source region 3 is produced (FIG. 12c).
4. Fourthly, the insulating layer 7 is removed off and then a gate insulating layer 5 is made to adhere on said regions and a gate electrode 6 is formed on said layer 5 (FIG. 12d).

The gate-drain feedback capacitance $C_{GD}$ is determined by surface area of the drain region just beneath the gate electrode 6, and said surface area has no relation to positioning accuracy because the drain region's portion having said area is formed at the place where the masking layer 7 has been formed. Determination of said area depends on photoengraving accuracy and diffusion accuracy, but is substantially caused by the photoengraving accuracy. Minimum value of said area is determined by minimum distance d of the drain region between the base regions 2. Considering that the photoengraving accuracy is generally of the order of 1 μ, the minimum distance d can be made to less than 2 μ. This fact is equivalent to the fact that the width in FIG. 10 becomes less than 1 μ.

Figure 13:
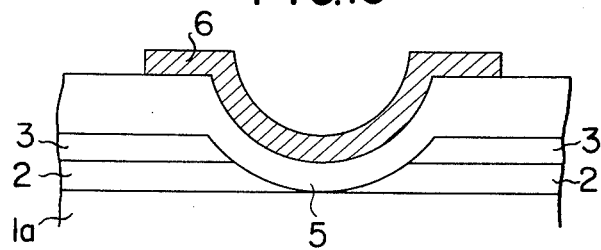
FIG. 13 shows a sectional view of still another example of an improved insulated gate field-effect transistor, in which its substrate forms a drain region.

Furthermore, since impurity concentration of the drain region 1a is lower than that of the base region 2, the depletion layer spreads into the drain region 1a, whereby the distance d is equivalently decreased. Accordingly, the minimum distance d of the drain region can be made to effectively less than 1 μ and can be made to substantially equal to the channel length. Moreover, this distance d is determined by only the photoengraving accuracy, fluctuation of the product quality is relatively low and the yield is improved. Of course, only main portion of the drain region just beneath the gate electrode may be planarly surrounded by the source region and the other portions of the drain region may have any pattern. This invention is also successfully applicable to the other type of the field-effect transistor such as shown in FIG. 13.

According to the structure illustrated in FIG. 11, a transistor having a cut-off frequency of several Giga-herz order can be easily obtained and a transistor amplifier which is stable at a frequency near its cut-off frequency can be easily manufactured because of low gate-drain feedback capacitance.

In general, the excellence of the frequency characteristics of a insulated gate field-effect transistor depends upon the gain band width product $f_t$ and the more said product $f_t$ is larger, the more said transistor can be used for higher frequency. If we let it be now assumed that the transconductance of insulated gate field-effect transistor (IGFET) and the sum of input and output capacitances are, respectively, represented by $g_m$ and C, the value $f_t$ in the case of using the transistor under a resistive load can be represented by the following equation $$f_t = \frac{g_m}{2\pi C} \tag{1}$$

Now, when an amplifier having a gain A is manufactured by IGFET, cut-off frequency $f_t$ of the amplifier can be represented by the equation obtained by putting C of the following equation into the equation (1).

$$C = C_{ds} + C_{gs} + (1 + A) C_{gd} \tag{2},$$

where $C_{ds}$, $C_{gs}$ and $C_{gd}$ represent, respectively, drain-source capacitance, gate-source capacitance, and gate-drain capacitance. Accordingly, the equation (1) can be represented by the following equation.

$$f_t = \frac{g_m}{\{2\pi \; C_{ds} + C_{gs} + (1+A) \; C_{gd}\}} \tag{3}$$

In the equation (3), since the capacitance $C_{gd}$ is not zero, when the gain A is designed so as to be larger, the gain band width product $f_t$ becomes small. Accordingly, the capacitance $C_{gd}$ must be selected to be small as much as possible in order to obtain an amplifier having a high performance.

In FIG. 13, there is shown an IGFET channel length of which can be made to less than 1 $\mu$, said transistor comprising gate insulating layer 5, a gate electrode 6, a drain region 1a, a base region 2 in which a channel is formed, and a source region 3. According to such structure as mentioned above, since the substrate is used as the drain region, if a gate lead electrode or terminal is provided on the insulating layer formed on the substrate according to the conventional method, the capacitance between said lead electrode and the substrate is added additionally to the above-mentioned capacitance $C_{gd}$, thereby to lower the performance of the transistor owing to the reason mentioned already.

The above-mentioned disadvantage can be effectively avoided, according to the invention, by providing directly or through an insulating layer the gate lead electrode on the source region or on the region wherein the channel is formed or on the region capable of being grounded in a.c. operation, thereby to protect the transistor from additional increase of the capacitance $C_{gd}$. Examples of such improved IGFET mentioned above are shown in FIGS. 14 and 15.

The IGFET shown in FIG. 14 comprises a source region 3, a base region 2 in which a channel is formed, a source electrode 13, a gate electrode 6 a source lead electrode 14, and a gate lead electrode 12. This electrode 12 is formed through an insulating layer on the base region 2. Since the base region 2 is generally coupled with the source region 3 in a.c. operation, the capacitance $C_{gs}$ is increased, whereby the gain band width $f_t$ is decreased, but does not decrease as much as the increase of the capacitance $C_{gd}$. That is, if let it be assumed that the capacitance due to the gate lead electrode corresponds to $C_g$, the increase of input capacitance C of the amplifier corresponds to $(1+A) C_g$ in the case when the gate lead electrode is formed, directly or through an insulating layer, on the substrate, but said increase of the input capacitance corresponds to $C_g$ in the case when said gate lead electrode is formed, through an insulating layer, on the source region 3 or base region 2. Moreover, in any tunned amplifier said increment $C_g$ of the latter case can be tuned out together with the capacitance $C_{gs}$ by means of tunning, so that the gain band with product $f_t$ of the transistor is not practically decreased in the case when said transistor is used in the tunned amplifier circuit.

Furthermore, the example shown in FIG. 14 may be modified in such a manner that, as shown in FIG. 15, the source and base regions 3 and 2 are separated off from the layers 16 and 15 beneath the source lead electrode 14 and gate lead electrode 12 in order to apply a bias between said layers 16, 15 and the drain region thereby to decrease the drain capacitance.

According to the structure of the example shown in FIG. 15, frequency characteristics can be more improved. In this example, as reverse biased layers 16 and 15 capable of being grounded in a.c. operation is provided beneath the source lead electrode 14 and gate lead electrode 12, feedback capacitance produced in the case when the gate is grounded can be decreased.

According to the example of FIGS. 14 and 15, the capacitance $C_{gd}$ between the gate and drain can be decreased, whereby a stable amplifier having a high gain at super high frequency and necessitating no neutralization can be obtained.

Figure 16:
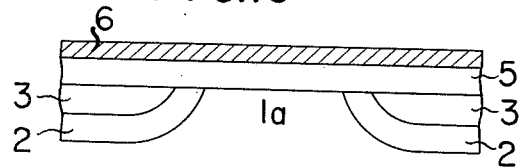
FIG. 16 shows a sectional view of an improved field-effect transistor adapted to high frequency use.

Furthermore, in the originally mentioned field-effect transistor as shown in FIG. 16, comprising a drain region 1a, base regions 2 in which channel is formed, source regions 3, a gate insulating layer 5, and a gate electrode 6; there is other cause for restraining free decrease of the gate-drain capacitance. That is, in the transistor shown in FIG. 16, the thickness of the insulating layer portion formed just above the drain region 1a or 1 cannot be increased more than the thickness of the gate insulating layer 5, feedback capacitance between the gate electrode and the drain region cannot be decreased to a value capable of imparting no effect to the frequency characteristics of the transistor. According to the invention, the above-mentioned drawback can be reduced by increasing the thickness of the insulating layer portion above the drain region 1a or 1, thereby to decrease the feedback capacitance between the gate electrode and drain region.

An example of the method of increasing thickness of the insulating layer portion above the drain region 1 is illustrated in FIG. 17. FIG. 17(a) relates to a case in which an insulating layer 17 containing an impurity forming a base region and another impurity forming a drain region is used as the insulating layer above the drain region, and FIG. 17 (b) relates to a case in which two layers consisting of an insulating layer 17a containing an impurity forming mainly a base region and another insulating layer 17b containing an impurity forming source region are used as the insulating layer above the drain region. The above-mentioned insulating layer or layers are made to uniformly adhere on the surface of a semiconductor substrate and said layer or layers are selectively removed while remaining only desired portions, or said insulating layer or layers are made to selectively adhere to desired portions of a semiconductor substrate. Then, said semiconductor substrate is put in a high temperature atmosphere and two kinds of impurities mentioned above are diffused into said substrate from said insulating layer or layers, thereby to form base regions 2 and drain region 1, as shown in FIG. 17(c). In this case, a semiconductor crystal consisting of a region 18 including an impurity for forming the source region 3 and is epitaxially deposited on a region 2a which includes an impurity of opposite conductivity type to said former impurity and which is used as the semiconductor substrate, and said crystal is subjected to diffusion treatment thereby to form the source region 3, base regions 2 and drain region 1. Then, a gate insulating layer 5 is formed and a gate electrode 6 is formed on said gate insulating layer 5.

According to the method mentioned in connection with FIG. 17, the drain region 1 and gate electrode 6 are superimposed through an insulating layer used as an impurity source, so that if thickness of said insulating layer is made thicker, the feedback capacitance between the gate and drain regions can be sufficiently decreased irrespective of thickness of the gate insulating layer 5. That is, since thickness of the thin portion of the insulating layer just above the drain region is about equal to the diffusion length of the drain region, mean thickness of the insulating layer above the drain region can be made to sufficiently thick.

Figure 18A:
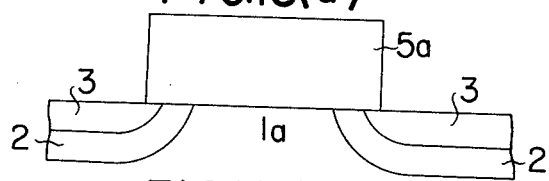
FIGS. 18(a), (b) and (c) show, respectively, sectional views for describing processes other than the processes illustrated in FIG. 17.
Figure 18B:
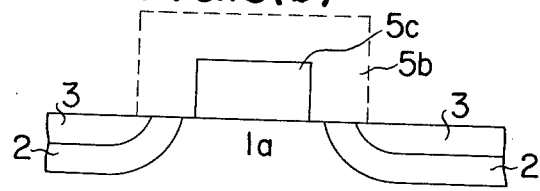
Figure 18C:
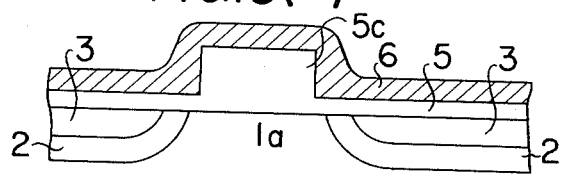

FIG. 18 shows a modification of the method illustrated in FIG. 17. According to the method of FIG. 18; as shown in FIG. 18(a), a thick insulating layer 5a having a desired shape is formed on a semiconductor substrate a portion of which is used as a drain region 1a, and then base regions 2 and source regions 3 are formed by diffusion processes by using twice the same insulating layer as a diffusion mask. Then, as shown in FIG. 18(b), a portion 5b of the insulating layer 5a is removed off by dissolution thereof, thereby to remove the thick insulating layer at the positions just above the base regions 2, but to remain the insulating layer at the position 5c just above the drain region 1 as much as possible. This removing treatment can be effeciently attained for example by using etchant consisting of a water solution of ammonium fluoride and hydrofluoric acid for $S_iO_2$. Lastly, as shown in FIG. 18(c), a thin gate insulating layer 5 is made to adhere or growth and a gate electrode 6 is deposited on said layer 5 by evaporation, said electrode being photoengraved to its desired dimension after said deposition, whereby a field-effect transistor having a relatively thick insulating layer on the drain region 1a can be obtained.

According to the structures of the examples shown in FIGS. 17 and 18, the capacitance between the drain region and gate electrode can be reduced to less than one-half of that of the conventional field-effect transistor, so that an excellent field-effect transistor capable of achieving a very stable amplification at frequency range near the intrinsic cut-off frequency of the transistor element itself can be obtained.

In the field-effect transistors mentioned above in which main part of the base region (said main part corresponds to a part forming a channel therein in the case of a field-effect transistor, but to base region's portion operating mainly in the case of a lateral transistor) is formed by diffusion, the concentration of impurity in the drain or collector region's portion adjoining the base region is relatively low, so that is it necessary to decrease drain resistance by providing a portion having a high impurity concentration at a position aparted by a minor distance (about 1/several $\mu \sim$ several $\mu$) from the base region.

Furthermore, in the case when all parts of the said drain region or collector region having a low impurity concentration becomes a depletion layer, thickness (distance) of said drain or collector region having a low inpurity concentration has a relation to carrier transit time, so that said thickness is an important dimension. According to the conventional method of manufacturing a transistor, since the pattern of the region having a high impurity concentration has been formed by a separate photoengraving process differing from that for determining the base region, thickness of the drain region's portion having a low impurity concentration is remarkably affected by dimension accuracy of photoengraving as well as positioning accuracy of the photoengraving, thus causing fluctuation of the characteristics of the products. Accordingly, small dimension cannot be expected. Particularly, the positioning accuracy varies remarkably in dependence on condition of the processing worker. This drawback can be effectively avoided in this invention by carrying out simultaneously the base positioning and positioning of the drain or collector portion having a high impurity concentration. A method therefor is illustrated in FIG. 19, in which two kinds of diffusion masks photoengraving echants of which are different to each other are used.

Figure 19A:
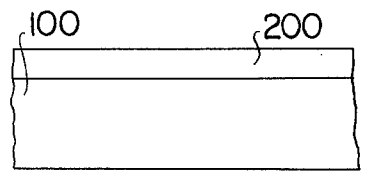
FIGS. 19 (a), (b), (c), (d), (e), (f), (g), (h), (i) and (j) show, respectively, sectional views for describing processes of manufacturing an example of the invention, said example corresponding to a field-effect transistor in which the drain resistance fluctuation the of said drain resistance, and the fluctuation of frequency characteristics are reduced in comparison with the case of conventional transistors.
Figure 19B:
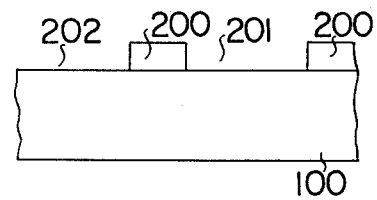
Figure 19C:
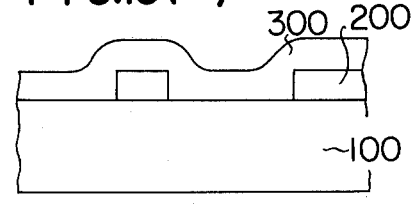
Figure 19D:
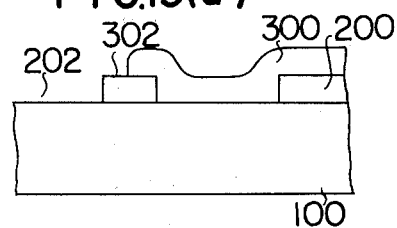
Figure 19E:
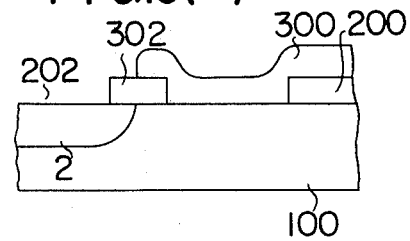

1. A diffusion mask 200 is made to adhere to a semiconductor substrate 100 (which becomes a drain or collector region). (FIG. 19a)
2. Diffusion hole 202 adapted to form a source or emitter region and a diffusion hole 201 adapted to form a drain or collector region are formed by photoengraving. (FIG. 19b)
3. A diffusion mask 300 made of a material differing from that of the mask 200 is made to adhere. (FIG. 19c)
4. A diffusion hole 302 larger than the diffusion hole 202 is formed in the mask 300. (FIG. 19d)

In this case, if the diffusion hole 302 is not superposed on the diffusion hole 201, dimension of the base region is determined irrespective of the positioning accuracy and pattern accuracy of pattern 302. When the diffusion masks 300 and 200 are, respectively, made of $Si_3N_4$ and $SiO_2$, $SiO_2$ of the mask 200 is not etched by the etchant such as phosphoric acid which is used for etching the hole 302, so that pattern of the previously etched mask 200 is not varied.

5. A base region 2 is formed by diffusion from the diffusion hole 202. (FIG. 19e)
6. The diffusion mask 300 is removed off and the diffusion hole 201 is exposed. (FIG. 19f)
7. Diffusion is simultaneously carried out through the diffusion holes 202 and 201, thereby to form a source or emitter region 3 and a drain or collector region 1 having a high impurity concentration. According to this treatment, distances of the base region and drain or collector region can be determined irrespective of the positioning accuracy of pattern 302.

To simplify the process, the above-mentioned process can be replaced by that using only one kind of the diffusion masks which are different in the thickness. In the process shown in FIG. 19(c) the diffusion mask 300-a which is the same material as the mask 200 but thiner than that is employed. In the process shown in FIG. 19(d), the etching time is controlled so that the thin mask 300-a in the part of the pattern 302 is fully dissolved but the mask 200 in the part of the pattern 302 is remained.

Figure 19F:
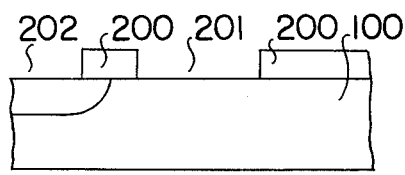
Figure 19G:
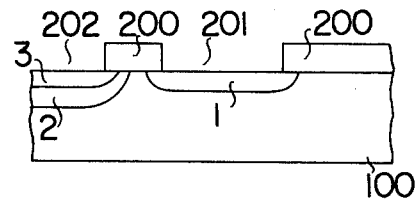
Figure 19H:
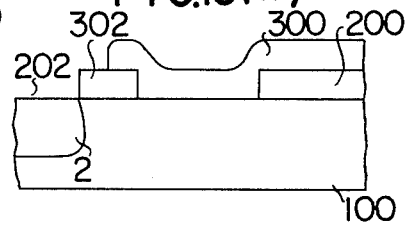
Figure 19I:
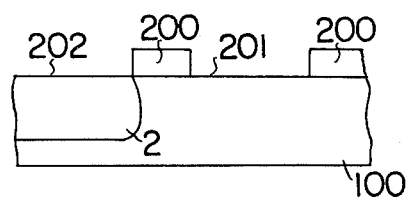
Figure 19J:
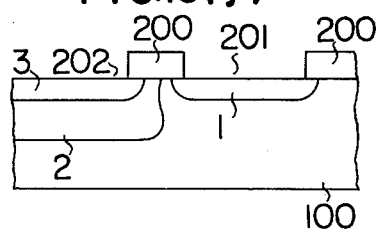

And in the process shown in FIG. 19(f) the mask 300-a is fully dissolved within the short enough time for the mask 200 to remain. In the case when ion implantation method is used for impurity introduction, the masks 200 and 300 may be, respectively, made of $SiO_2$ and Al which are formed by evaporation. In this method, the following processes are successively carried out. An ion implantation hole 302 is formed in the ion implantation mask 300 according to process of FIG. 19(d), an impurity adapted to form a base region is implanted through said hole 202 only (FIG. 19h), all parts of the ion implantation mask 300 are removed off (FIG. 19i), and then source or emitter region 3 and drain or collector region 1 are formed by ion implantation or diffusion (FIG. 19j).

In the case of ion implantation method also, fluctuation due to positioning accuracy would not be introduced in the distance between the base region and drain or collector region having a high impurity concentration, as in the same manner as the case of diffusion method according to FIG. 19(a) to FIG. 19(g). Furthermore, in the case of ion implantation method, there are advantages such that impurity distribution and distance in the depth direction and impurity distribution and distance in the lateral direction can be independently selected. In the case when insulating layers each containing respective impurity is used as an impurity source, the method illustrated in FIG. 20 can be adopted. The following example relates to the structure of $n^+ pnn^+$ and will be described as follows.

Figure 20A:
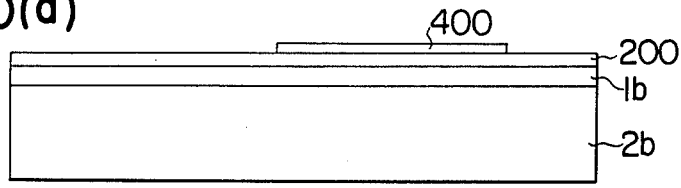
FIGS. 20(a), (b) and (c) show, respectively, sectional views for describing other processes of manufacturing the transistor according to the invention.

1. A thin insulating layer 200 is formed or grown on a n type semiconductor layer 1b which is provided on a p type region 2b, an insulating layer 400 containing p type impurity adapted to form a base region is made to adhere to said layer 200, and then said layer 400 is subject to photoengraving to form a pattern including plane pattern of base region and being not intersected with drain region having a high impurity concentration. (FIG. 20a)

Figure 20B:
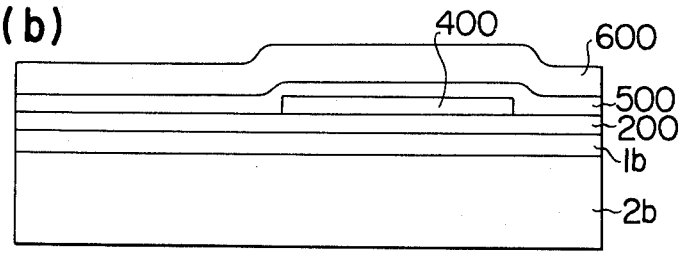

2. An insulating layer 500 containing a type impurity is made to adhere to said layers 200 and 400, and then an insulating layer 600 containing no impurities is made to adhere to said layer 500. (FIG. 20b)

Figure 20C:
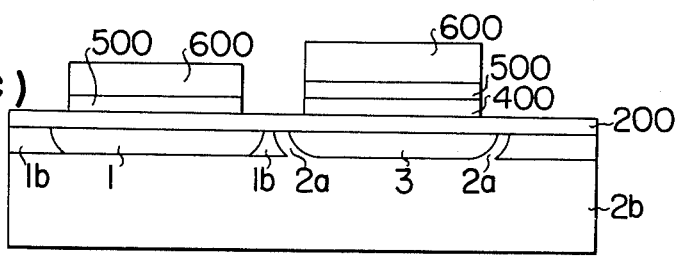

3. Photoengraving is carried out to form patterns adapted to determine a base region and a source or emitter region and adapted to determine a drain or collector region containing a high impurity concentration, whereby necessary portions of the insulating layers 400 and 500 containing impurity and the insulating layer 600 containing no impurity are made to remain. Then, impurities in the insulating layers are diffused into the semiconductor layer 1b and 2b at a high temperature, whereby main base regions 2a, a source or emitter region 3, and a drain or collector region 1 are formed. (FIG. 20c)

In the case of the example of FIG. 20, it is required that the impurity contained in the insulating layer 400 is larger in its diffusion constant in the semiconductor than that of the impurity contained in the insulating layer 500. In this case, when patterns of the base regions and drain or collector region are to be formed by photoengraving, positioning accuracy can be made to be not affected by the distance between the base regions and drain or collector region so far as positions of said patterns and position of the pattern formed previously in the insulating layer 400 can be mutually matched within range of allowable positioning accuracy. The example of FIG. 21 relates to the case in which diffusion constant of a impurity forming the drain or collector region in the insulating layer is larger than that of the impurity forming the base region and said diffusion constant relation in the semiconductor is reverse to the former relation, method of manufacturing the transistor in said example being described as follows.

Figure 21A:
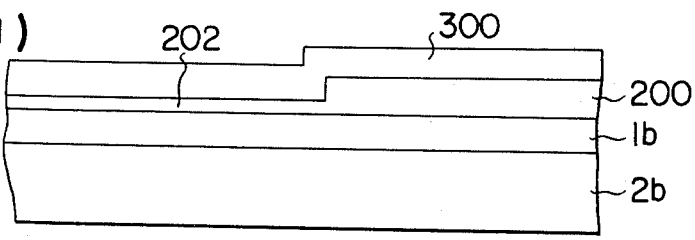
FIGS. 21(a), (b) and (c) show, respectively, sectional views for describing a still other processes of manufacturing the transistor according to the invention.

1. A thick oxide layer 200 covering a drain or collector region having a high impurity concentration and a shape being not intersected with source or emitter region and a thin oxide layer 202 are formed on a semiconductor layer 1b which is provided on p type region 2b. Then, an insulating layer 300 containing impurities of n type and p type is made to adhere to said layers 200 and 202. (FIG. 21a)

2. Patterns for determining a base region and a drain or collector region contaning a high impurity concentration are formed by photoengraving, as in the same manner as that of the example shown in FIG. 20c.

3. Then, a diffusion process is carried out in a high temperature atmosphere, thereby to form a base region 2a, a source or emitter region 3, and a drain or collector region 1a having a high impurity concentration.

Figure 21B:
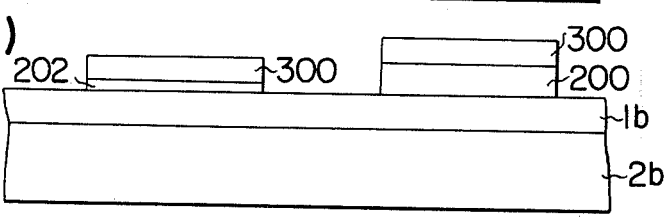
Figure 21C:
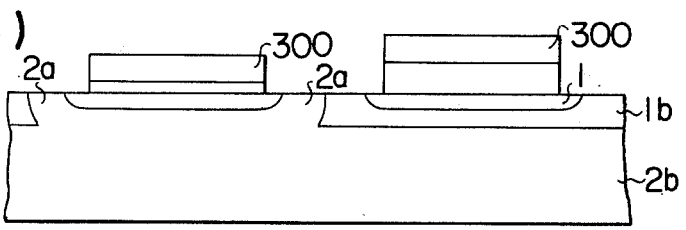

According to the examples of FIGS. 19, 20 and 21, since the distance between the drain or collector region and the base region is not imparted with any affection by positioning accuracy in the case of photoengraving, an excellent transistor which is low in its drain resistance, fluctuation of said resistance and fluctuation of frequency characteristics can be obtained.

Figure 22:
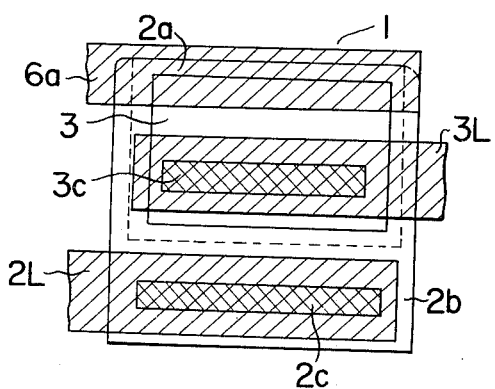
FIG. 22 shows a plane view of another conventional field-effect transistor, the region of which is formed by impurity diffusion.

As shown in FIG. 22, in the above-mentioned field-effect transistors, for the purpose of forming an ohmic contact 2c with a base region 2a, a diffusion layer 2b formed from a diffusion hole differing from that of the base region 2a and having the same conductivity type as that of said base region is required. Furthermore, in this transistor, in order to provide a ohmic contact 3c with the source region 3 so that said contact position must be within the surface of the source region, it has been usual to determine said contact position at inner side separated by a safety distance from end of the source region, said safety distance depending on accuracies of their dimensions and positionings and the like. For this reason, surface area of the base regions (2a+2b) becomes large, so that it is very difficult to decrease capacitance between drain region 1 and the base region, thus causing deterioration of high frequency characteristics of the transistor. In FIG. 22, the numerals 2L, 3L and 6a designate, respectively, a metal layer for leading out a base electrode, a metal layer for leading out a source electrode, and a metal layer for leading out a gate electrode.

Figure 23:
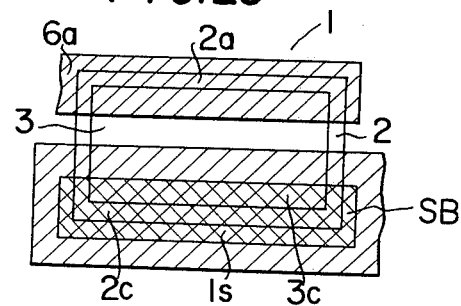
FIG. 23 shows a plane view of an example according to the invention, said example corresponding to an improvement of the transistor shown in FIG. 22.

The disadvantage mentioned above in connection with the transistor shown in FIG. 22 can be effectively eliminated by constructing the transistor in such a manner that the ohmic contact metal of the source or base region is allowed to contact on the drain region, but Schottky junction consisting of metal and semiconductor is formed on the drain region thereby to cause substantially no current flowing from the drain region, then the area necessary for forming the ohmic contact with source or base region is made small and therefore the capacitance between the drain and base regions can be reduced. Such an example is shown in FIG. 23. Referring to FIG. 23, the following processes are successively carried out, that is: an n type thin region having a resistance more than 0.01 $\Omega$cm is grown on n type low resistance substrate made of silicon by means of diffusion treatment or epitaxial growth method; a diffusion mask made of an insulating material is formed on said thin region and then a diffusion hole is perforated in said mask; a base region 2 and a source region 3 are formed by carrying out diffusion of impurities through the same diffusion hole mentioned above; a portion of the previously formed insulating layer, said portion corresponding to the position where a gate lead electrode 6a is made to adhere, is removed off; a thin gate insulating layer is made to adhere or grown thereon; holes (1S + 2C + 3C) corresponding to drain + base + source regions are perforated insulating layer; and then a metal capable of forming Schottky barrier (for example Al) is made to adhere by vacuum evaporation and whole members are subjected to heat treatment. Lastly, a gate lead electrode 6a and a common lead electrode SB for a source and a base are formed by means of photoengraving. Portions where the electrode SB is contacted, respectively, with the source and base regions are shown by 3C and 2C. Since surface impurity concentrations of said source and base regions are large, contact portion between the metal and the semiconductor has an ohmic contact characteristic, and furthermore, impurity concentration of the drain region is low at the portion 1S, so that Schottky junction is formed at said portion 1S. Accordingly, even when metal of the source-base lead electrode SB is in contact with the drain region, the drain and source regions are not brought in short-circuited state.

According to the example of FIG. 23, as will be clear from the above-mentioned description, capacitance between the drain and base regions can be reduced, thus improving high frequency characteristics and miniturization of a field-effect transistor.

We claim:

1. In a field effect transistor comprising a semiconductive wafer including at least first, second and third regions comprising drain, base and source regions respectively, said third region having the same conducivity type as said first region and having a higher impurity concentration than that of said first region, said second region having a conductivity type opposite to that of said first region and being disposed between said first and third regions to form p-n junctions with said first region and with said third region, said first region having at least one surface zone emerging at one surface of said wafer, said zone separating portions of said second region emerging at the surface of the wafer, a conductive material overlying said surface zone, said portions of the second region emerging at the surface of the wafer and a part of said third region, a dielectric coating separating said conductive material from said wafer and electrical contacts connected to said regions; the improvement comprising: said first region comprising silicon having an impurity concentration N atoms/cm$^3$ satisfying the following relationship:

$$4 \times 10^7 \text{ cm}^{-1/2}/\sqrt{N} \geq L_D$$

where $L_D$ is a lateral dimension in microns of said surface zone of the first region, whereby a depletion region is formed in said surface zone underlying said conductive material thereby decreasing a capacitance between said first region and said conductive material.

* * * * *